United States Patent [19]
Ohba et al.

[11] Patent Number: 5,378,507
[45] Date of Patent: Jan. 3, 1995

[54] DRY COATING METHOD

[75] Inventors: Kazuo Ohba, 2-3, Matsubacho 4-chome, Higashimatsuyama-shi, Saitama; Yoshinori Shima, 768-15, Ohzenji, Asao-ku, Kawasaki-shi, Kanagawa; Akira Ohba, 12-89, Miyado 3-chome, Asaka-shi, Saitama, all of Japan

[73] Assignees: Sakae Electronics Industrial Co., Ltd.; Kazuo Ohba, both of Saitama; Yoshinori Shima, Kanagawa; Akira Ohba, Saitama, all of Japan

[21] Appl. No.: 71,487

[22] Filed: Jun. 4, 1993

[30] Foreign Application Priority Data

Jun. 11, 1992 [JP] Japan .................................. 4-152035

[51] Int. Cl.6 .................................................. B05D 3/06
[52] U.S. Cl. .................................... 427/534; 427/237; 427/238; 427/307; 427/535; 427/539; 427/540; 427/571; 427/575
[58] Field of Search ................ 427/533, 534, 540, 539, 427/569, 571, 575, 237, 238, 307

[56] References Cited

FOREIGN PATENT DOCUMENTS

| 279895 | 8/1987 | European Pat. Off. . |
| 61-911 | 1/1986 | Japan . |
| 62-44235 | 9/1987 | Japan . |
| 2-47851 | 10/1990 | Japan . |
| 3-52217 | 8/1991 | Japan . |
| WO9206224 | 4/1992 | WIPO . |

OTHER PUBLICATIONS

Patent Abstracts of Japan, vol. 016, No. 063 (C-0911) 18 Feb. 1992 & JP-A-03 260 073 (Fuji Electric Co. Ltd) 20 Nov. 1991—Abstract.

Primary Examiner—Bernard Pianalto
Attorney, Agent, or Firm—Flynn, Thiel, Boutell & Tanis

[57] ABSTRACT

A continuous dry coating method and an apparatus therefor which are capable of removing cut chips and burrs from and smoothing inner walls of small-diameter holes in a substrate material and, then, successively performing a cold coating on these small holes in a short period of time. The continuous dry process coating method comprises the steps of: arranging electrodes on opposite sides of a substrate material; performing a plasma discharge to surface-treat small holes made in the substrate material; and then performing an electron cyclotron resonance plasma (ECR plasma) coating on the surfaces of these holes.

3 Claims, 1 Drawing Sheet

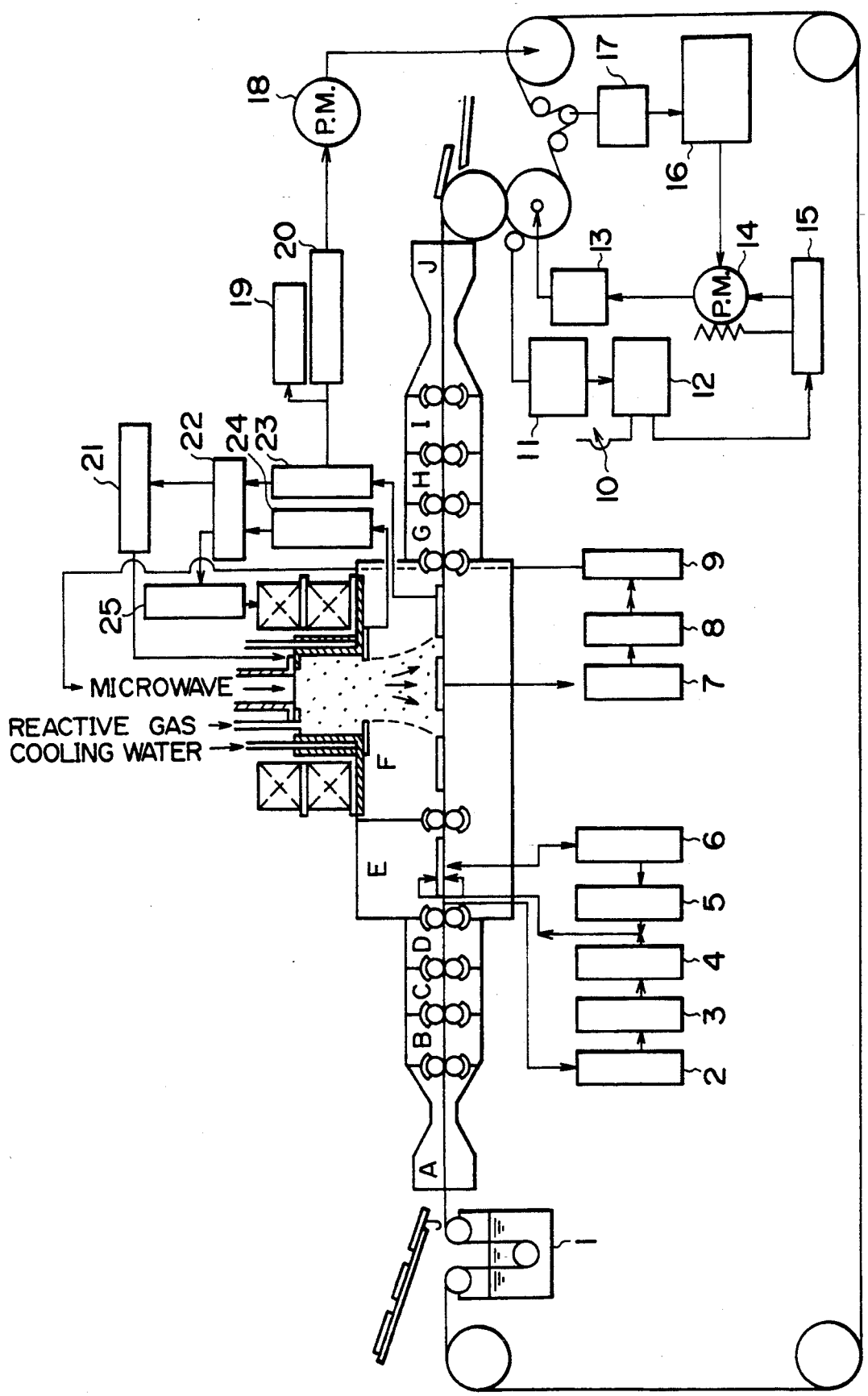

DRY COATING METHOD

BACKGROUND OF THE INVENTION

1. Field of the Invention

The present invention relates to a method and an apparatus which perform in dry conditions and at high speeds a series of processes including disposal of cut chips in small holes drilled in a substrate, removal of roughness of the inner walls of the holes, and activation and coating (plating) of these walls.

2. Description of the Prior Art

A conventional method of forming holes in substrates made of a polyamide resin or a glass fiber-reinforced epoxy resin is performed by machining with a drill. The problem with this method is that as the hole diameter is reduced to about 0.25–0.1 mm, breakage or wear of the edge of the drill often causes clogging of the hole by cut chips, roughening of the inner walls of the drilled holes and burrs, the elimination of which are no longer possible by a wet ultrasonic cleaning method. With electroplating, the smaller the hole diameter, the more difficult it is for plating liquid to enter the holes, leaving air bubbles in the holes. The result is a poor plating performance.

SUMMARY OF THE INVENTION

An object of this invention is to provide a method and an apparatus which are capable of performing successively and reliably in short times a series of processes consisting of removing cut chips from small holes in a substrate, smoothing inner walls of the holes, removing burrs, activation, and cold-coating these inner walls.

Therefore, the present invention is directed to a continuous dry process coating method comprising the steps of:

arranging electrodes on opposite sides of a substrate material;

performing a plasma discharge to surface-treat small holes made in the substrate material; and performing an electron cyclotron resonance plasma (ECR plasma) coating on the surfaces of these holes.

In a further aspect, the present invention is directed to a continuous dry process coating apparatus for carrying out the aforestated method which comprises a plasma discharge device and an ECR plasma coating device.

BRIEF DESCRIPTION OF THE DRAWING

The single FIGURE is a schematic illustration showing an example of an apparatus for implementing the dry process coating method of this invention.

DETAILED DESCRIPTION OF THE PREFERRED EMBODIMENTS

The present invention will be described in more detail hereinbelow.

In the foregoing dry process coating apparatus of the present invention, firstly, electrodes are arranged on opposite sides of a substrate material and a plasma discharge processing is performed to remove cut chips produced by drilling small-diameter holes in the substrate material and smooth and activate the rough inner wall surfaces of the holes. Subsequently, an electron cyclotron resonance plasma (ECR plasma) coating is performed.

In the preferred embodiment, the plasma discharge is performed under the conditions of an atmospheric pressure at 10 to $2 \times 10^3$ Torr a $\tau_{on}$ of voltage waveform at 5 μs to 20 s, and the ECR plasma coating is performed by supplying a pulse current of 0.01–500 ms in pulse width to an electromagnet in a direction perpendicular to and parallel to the propagating direction of a microwave to generate a pulse magnetic field of 0.08 T or higher. During the ECR plasma coating, a pulse electric field with a $\tau_{on}$ of 0.1 μs–$1 \times 10^6$ μs can be applied to an electric field of plasma flow.

In the method of the present invention, in particular, a belt conveyor may be used in order to continuously perform the plasma discharge processing and the ECR coating.

The processing atmosphere used in this invention is any one of air, a non-oxidizing gas, a reactive gas and water vapor.

The plasma discharge processing mentioned above has been already proposed by the present Applicants. (Japanese Patent Application No. 4-85654). In the presence of the above-mentioned processing atmosphere, electrodes are placed on opposite sides of a substrate material to be processed; a voltage is applied to these electrodes to discharge a plasma under an atmospheric pressure of $10–2 \times 10^3$ Torr to surface-treat inner walls of the small holes in the substrate material. This plasma discharge processing obviates an additional step of removing cut chips from the holes, makes the inner walls of the small holes smooth and burr-free and activates the inner walls.

The ECR plasma coating can selectively heat electrons in the plasma by ECR heating, so that the electron temperatures are high while ions remain cold. This characteristic is important for producing a good beam of large current. Therefore, as discussed in Applicants' previous Japanese Patent Application Nos. 4-150783 and 4-150787, the ECR plasma coating does not require heating of the substrate at all, unlike the conventional heat CVD method, and is also capable of performing an anisotropic processing. In the ECR plasma method utilizing the ECR phenomenon, the ions are prevented from becoming heated to high temperatures by applying a pulse magnetic field in a direction parallel to and perpendicular to the microwave direction.

The effect of the pulse magnetic field is to enable excellent precision coating, increased speed of coating, and ability to perform a low-temperature coating. Further, by properly setting the atmosphere, pressure, discharge pulse width and peak voltage, and pulse magnetic field, the processing can be performed successively.

Now, the present invention will be described in conjunction with an example of an embodiment.

The figure shows a continuous processing apparatus of a belt conveyor type. Starting at the left side of the apparatus, the belt is cleaned in a cleaning bath 1. Before the belt enters a chamber A, substrates are placed on the belt. The pressure of the atmosphere is changed stepwise through multiple rooms, from the room A to B to C to D, with shutters installed between each room. The substrates are carried on the belt through these rooms and into room E where the thickness of each substrate is detected in operation 2 and, in operation 4, a pulse source voltage is controlled through a control circuit 3 to perform a plasma discharge processing under a low pressure of about $10^2$ Torr. At this time, in operation 6, the amount of light transmitted is also detected to further control the pulse voltages through a control circuit 5. The substrates, which were processed reliably in this way at a high precision by these controls, are fed to the next room F where they are subjected to an ECR plasma processing using a mixture of reactive gases of CuI, VOCl$_3$ and PH$_3$ in the pressure range of $1\times10^0$ to $1\times10^{-5}$ Torr. At the same time, a beam current is detected in operation 24 to control a pulse magnetic field current by a magnetic field power source 25 through a control circuit 22 and thereby give anisotropy to the substrates. The temperature is detected in operation 7 and regulated by controlling a microwave power supply 9 through a control circuit 8. The film thickness is detected in operation 23 to control a pulse power source (ion power supply) 21 through the control circuit 22 and, thereby, regulate the film thickness. After a certain thickness of Cu coating is obtained, the substrates are then fed by belt conveyor through multiple rooms from G to H to I to J, where the pressure is increased stepwise, and, then, out into the open air. This series of substrate transfer is done by appropriately regulating the speed of the belt conveyor at a speed control section 10 having a rotary generator 11, a pulse oscillator 12, a reduction gear 13, a pulse motor 14, a control circuit 15, an SCR (silicon controlled rectifier) control circuit 16 and a tension detector 17, according to the size and thickness of the substrates to be processed, the hole diameter and the number of holes. Reference numeral 19 is a recorder for the film thickness and a pulse motor 18 is controlled through a control circuit 20.

EXAMPLE

Resin substrates, each measuring 1 mm thick by 20 cm long by 30 cm wide, were drilled by an NC drilling machine to form holes 0.2 mm and 0.15 mm in diameters at 5 mm-intervals over the entire surface of each substrate. A total of 2300 holes was formed in each substrate. Clogging by cut chips remaining in the holes made by the fine 0.2-mm drill increased significantly after about 544 holes were drilled, while that by the fine 0.15-mm drill increased after about 364 holes were drilled.

These substrates were put on a belt conveyor and moved at speeds of 0.25 cm/sec. The plasma discharge was carried out with two electrodes spaced 8 mm from each other and peak voltage set to 9000 V ($\tau_{on}$ of voltage waveform at 10 ms) for 0.2-mm holes under an atmospheric pressure of 760 Torr. For the 0.15-mm holes, the same conditions were used for plasma discharge. The ECR plasma processing was conducted under the following conditions:

Pressure of reactive gases of CuI, VOCl$_3$ and PH$_3$: 1 Torr,

Pulse current: 0.05 ms pulse width in a direction parallel to and 0.05 ms pulse width in a direction perpendicular to the propagating direction of a microwave Flux density: 0.12 T, Pulse electric field: $\tau_{on}$ of 0.05 ms and Cu coating speed: 0.96 μm/min.

The surface obtained was very smooth.

As is seen from the above result, with the totally dry, continuous processing method of this invention which combines a plasma discharge processing and an ECR plasma processing, it has become possible to remove cut chips in drilled small holes at high speed and perform the ECR plasma coating with high efficiency, which have been nearly impossible to obtain up to the present.

What is claimed is:

1. A continuous dry coating method comprising the steps of:

arranging electrodes on both sides of a substrate material;

performing a plasma discharge to surface-treat small holes made in the substrate material; and performing an electron cyclotron resonance plasma coating on the surfaces of these holes, wherein the plasma discharge is performed under the conditions of an atmospheric pressure of 10 to $2\times10^3$ Torr and a $\tau_{on}$ of voltage waveform of 5 μs to 20 s, and the ECR plasma coating is performed by supplying a pulse current of 0.01–500 ms in pulse width to an electromagnet in a direction perpendicular to and parallel to the propagation direction of a microwave to generate a pulse magnetic field of 0.08 T or higher.

2. A continuous dry process coating according to claim 1, wherein the plasma discharge is carried out in a processing atmosphere is selected from the group consisting of air, a non-oxidizing gas, a reactive gas and steam.

3. A continuous dry process coating according to claim 1, wherein a pulse electric field with a $\tau_{on}$ of 0.1 μs–$1\times10^6$ μs is applied to an electric field of plasma flow during the ECR plasma coating.

* * * * *

UNITED STATES PATENT AND TRADEMARK OFFICE
CERTIFICATE OF CORRECTION

PATENT NO. : 5 378 507
DATED : January 3, 1995
INVENTOR(S) : Kazuo OHBA et al

It is certified that error appears in the above-indentified patent and that said Letters Patent is hereby corrected as shown below:

```
Column 4, line 42; change "atmosphere is selected"
            to ---atmosphere selected---.
```

Signed and Sealed this

Second Day of January, 1996

*Attest:*

BRUCE LEHMAN

*Attesting Officer*  Commissioner of Patents and Trademarks